(12) United States Patent
Lee

(10) Patent No.: US 7,691,663 B2
(45) Date of Patent: Apr. 6, 2010

(54) CMOS IMAGE SENSOR HAVING DOUBLE GATE INSULATOR THEREIN AND METHOD FOR MANUFACTURING THE SAME

(76) Inventor: Ju-Il Lee, 1 Hyang jeong-dong, Heungduk-gu, Cheonju-si, Chungcheongbuk-do, 361-725 (KR)

( * ) Notice: Subject to any disclaimer, the term of this patent is extended or adjusted under 35 U.S.C. 154(b) by 255 days.

(21) Appl. No.: 11/657,908

(22) Filed: Jan. 24, 2007

(65) Prior Publication Data
US 2007/0120159 A1    May 31, 2007

Related U.S. Application Data

(63) Continuation-in-part of application No. 10/731,853, filed on Dec. 8, 2003, now abandoned.

(30) Foreign Application Priority Data
Apr. 30, 2003    (KR)    ............... 2003-27810

(51) Int. Cl.
*H01L 21/00* (2006.01)
(52) U.S. Cl. ........................ 438/87; 438/275
(58) Field of Classification Search ............ 438/57, 438/87, 275
See application file for complete search history.

(56) References Cited

U.S. PATENT DOCUMENTS

| | | | |
|---|---|---|---|
| 5,134,489 A | 7/1992 | Sauer | |
| 5,707,487 A * | 1/1998 | Hori et al. | 438/703 |
| 5,780,858 A | 7/1998 | Waechter et al. | |
| 5,804,491 A * | 9/1998 | Ahn | 438/425 |
| 5,962,856 A | 10/1999 | Zhao et al. | |
| 6,146,795 A * | 11/2000 | Huang et al. | 430/30 |
| 6,169,286 B1 | 1/2001 | Singh | |
| 6,184,055 B1 * | 2/2001 | Yang et al. | 438/57 |
| 6,194,258 B1 * | 2/2001 | Wuu | 438/200 |
| 6,333,205 B1 * | 12/2001 | Rhodes | 438/69 |
| 6,362,049 B1 * | 3/2002 | Cagnina et al. | 438/258 |
| 6,642,543 B1 * | 11/2003 | El Gamal et al. | 257/72 |
| 2001/0012225 A1 * | 8/2001 | Rhodes | 365/200 |

FOREIGN PATENT DOCUMENTS

JP    11-224942    8/1999

* cited by examiner

*Primary Examiner*—Thomas L Dickey
(74) *Attorney, Agent, or Firm*—McAndrews, Held & Malloy, Ltd.

(57) ABSTRACT

A method for manufacturing a CMOS image sensor includes: preparing a semiconductor substrate incorporating therein a p-type epitaxial layer by epitaxially growing up an upper portion of the semiconductor substrate; forming a pixel array in one predetermined location of the semiconductor substrate, the pixel array having a plurality of transistors and a photodiode therein, wherein each transistor employs a gate insulator with a thickness ranging from 40 Å to 90 Å; and forming a logic circuit in the other predetermined location of the semiconductor substrate, the logic circuit having at least one transistor, wherein the transistor employs a gate insulator with a thickness ranging from 5 Å to 40 Å.

18 Claims, 6 Drawing Sheets

CMOS IMAGE SENSOR HAVING DOUBLE GATE INSULATOR THEREIN AND METHOD FOR MANUFACTURING THE SAME

The present patent application is a Continuation-In-Part of application Ser. No. 11/731,853, filed Dec. 8, 2003 now abandoned.

FIELD OF THE INVENTION

The present invention relates to a method for manufacturing a semiconductor device; and, more particularly, to a method for manufacturing a complementary metal oxide semiconductor (CMOS) image sensor having a double gate insulator in a pixel array with enhanced optical property and electrical property.

DESCRIPTION OF THE PRIOR ART

As is well known, a photodiode image sensor device is the most commonly used a device for detecting images. A typical photodiode image sensor device comprises a reset transistor and a light sensor region formed by a photodiode. For example, a photodiode is formed with an n-type doped region and a p-type substrate. When the photodiode image sensor is in operation, a voltage is applied to the reset transistor gate to turn on the reset transistor and to charge the N/P diode junction capacitor. The reset transistor is turned off when the charging of the N/P diode junction capacitor has reached a certain high voltage. The N/P diode generates a reverse bias to form a depletion region. When a light is projected on the N/P diode light sensor, electrons and holes are generated. These holes and electrons are separated by the electrical field of the depletion region, causing the electrons to travel in the direction of the N-type doped region to lower the voltage of the N-type doped region, whereas the holes travel in the direction of the P-type substrate.

A charge coupled device (CCD) image sensor has a high dynamic range and a low dark current. The sophistication of the current technology of the CCD image sensor allows the CCD image sensor to become the most popular image sensing device. The manufacturing for the CCD image sensor is, however, rather special. The price of the CCD image sensor is therefore very high. Moreover, the driver requires a high voltage operation, leading to problems of high power dissipation and inability of random access of memory.

Meanwhile, a complementary metal oxide semiconductor (CMOS) image sensor has the characteristics of high quantum efficiency, low read noise, high dynamic range and random access. The CMOS image sensor can combine with other control circuit, A/D converter and several signal processing circuits on a single wafer to achieve the so-called system on a chip (SOC). The progress of the technology of a CMOS image sensor, therefore, greatly reduces the cost of an image sensor device, the picture size and the power of dissipation. The CMOS image sensor is therefore recently replacing the CCD image sensor.

Referring to FIG. 1, there is provided a cross sectional view of a conventional CMOS image sensor 100 including a semiconductor substrate 110, a p-type epitaxial layer 112, a pixel array 101, a logic circuit 102 and field oxide (FOX) regions. Herein, the p-type epitaxial layer 112 is formed by epitaxially growing up an upper portion of the p-type semiconductor substrate 110. The pixel array 101 and the logic circuit 102 are isolated from each other by forming the FOX region therebetween.

In the pixel array 101, a p-well 114 is formed in a predetermined location of the p-type epitaxial layer 112 of the pixel array 101, where a drive transistor (Dx) and a select transistor (Sx) are formed in a post fabrication process. In the other predetermined location of the p-type epitaxial layer 112 in the pixel array 101, there is formed a buried photodiode (BPD), where a transfer transistor (Tx) and a reset transistor (Rx) are formed by a post fabrication process. Herein, the BPD has a PN junction of a deep n-type diffusion layer (DEEP N$^-$) and a shallow p-type diffusion layer (P$^0$), wherein the p-type diffusion layer (P$^0$) is formed on the deep n-type diffusion layer (DEEP N$^-$) by using a method such as an ion-implantation technique or the like.

One side of a gate electrode 116A of the transfer transistor (Tx) is connected to the BPD and the other side is connected to a floating diffusion region (FD), wherein the gate electrode 116A of the transfer transistor (Tx) is formed on a gate insulator 134.

In addition, one side of a gate electrode 116B of the reset transistor (Rx) is connected to the floating diffusion region (FD) and the other is connected to a power supply voltage (VDD), wherein the gate electrode 116B of the reset transistor (Rx) is formed on the gate insulator 134.

The drive transistor (Dx) and the select transistor (Sx) have each n-type lightly doped drains (N-LDD) 118 in source/drain regions 120 by ion-implanting p-type atoms into the p-well 114, while the reset transistor (Rx) and transfer transistor (Tx) have no N-LDDs therebetween. One of the source/drain regions 120 of the select transistor (Sx) plays a role as an output. A gate electrode 116C of the drive transistor (Dx) is connected to the floating diffusion region (FD). Herein, each gate insulator 134 employs a single layer in the conventional CMOS image sensor. A reference numeral 138 which is not illustrated above is sidewall spacers.

In the logic circuit 102, there is a p-well 122 for forming an n-MOSFET (n-type metal-oxide-silicon field effect transistor) 150 and an n-well 124 for forming a p-MOSFET 152, wherein the p-well 122 and the n-well 124 are disposed side by side in the p-type epitaxial layer 112. The n-MOSFET 150 has source/drain regions 126 with N-LDDs 128 by ion-implanting p-type atoms into the p-well 122 and the p-MOSFET 152 has source/drain regions 130 with P-LDDs 132 by ion-implanting n-type atoms into the n-well 124.

The conventional CMOS image sensor 100 having the single gate insulator 134 in the pixel array 101 may be applicable to device scale beyond 0.35 μm without lowering a photosensitivity and an electrical property.

However, since the conventional CMOS image sensor 100 has the single gate insulator 134 in both the pixel array 101 and the logic circuit 102 so that it is very difficult to secure desired optical property such as photosensitivity and electrical property simultaneously, the conventional CMOS image sensor 100 can be hardly applicable to the device scale less than 0.25 μm using a deep submicron technology.

SUMMARY OF THE INVENTION

It is, therefore, an object of the present invention to provide a complementary metal oxide semiconductor (CMOS) image sensor with enhanced optical property and electrical property by employing a double gate insulator in a pixel array and a single gate insulator in a logic circuit.

It is another object of the present invention to provide a method for manufacturing a CMOS image sensor with enhanced optical property and electrical property by employing a double gate insulator in a pixel array and a single gate insulator in a logic circuit.

In accordance with one aspect of the present invention, there is provided a complementary metal oxide semiconductor (CMOS) image sensor, including: a semiconductor substrate incorporating therein a p-type epitaxial layer formed by epitaxially growing up an upper portion of the semiconductor substrate; a pixel array formed in one predetermined location of a semiconductor substrate, having a plurality of transistors and active areas therein; and a logic circuit formed in the other predetermined location of the semiconductor substrate having active areas and at least one transistor for processing a signal from the pixel array, wherein a gate insulator of each transistor in the pixel array is thicker than a gate insulator of the transistor in the logic circuit.

In accordance with another aspect of the present invention, there is provided a method for manufacturing a CMOS image sensor, the method including the steps of: a) preparing a semiconductor substrate incorporating therein a p-type epitaxial layer, wherein the semiconductor substrate is divided into two parts of which one part is defined as a pixel array and the other part is defined as a logic circuit, the pixel array being isolated from the logic circuit by means of a field oxide region therebetween; b) forming a first gate insulator on a top face of the p-type epitaxial layer; c) forming a mask on a top face of the first gate insulator in the pixel array; d) removing the first gate insulator in the logic circuit by using the mask; e) removing the mask in the pixel array; f) forming the second gate insulator on the top face of the first gate insulator in the pixel array and a top face of the p-type epitaxial layer in the logic circuit; g) forming a photodiode and a plurality of transistors in the pixel array and at least one transistor in the logic circuit for processing a signal from the pixel array.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
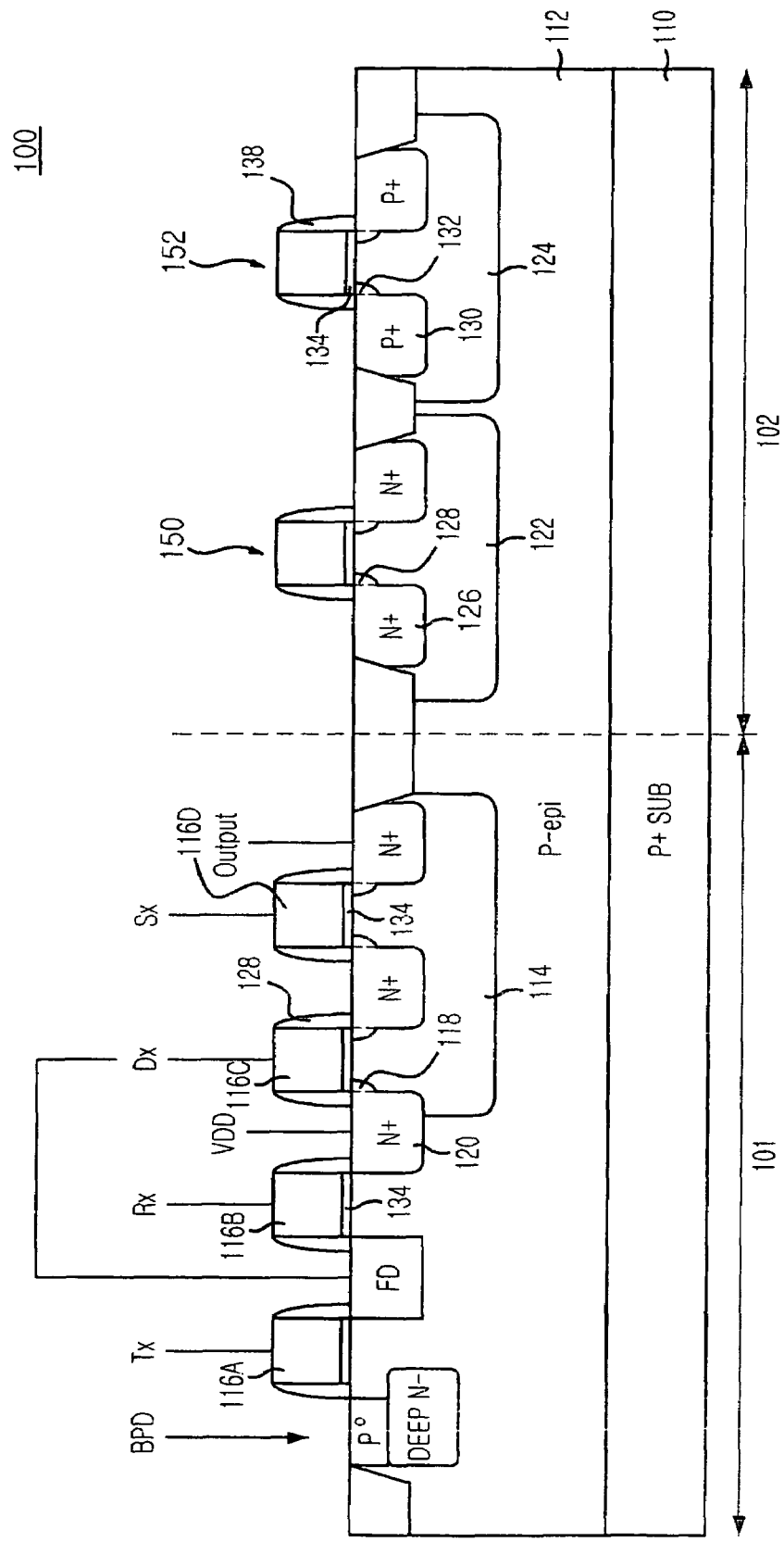
FIG. 1 is a cross sectional view setting forth a conventional complementary metal oxide semiconductor (CMOS) image sensor having a single gate insulator in a pixel array.

There are provided in FIG. 2 and FIGS. 3A to 3D cross sectional views of a complementary metal oxide semiconductor (CMOS) image sensor and cross sectional views setting forth a method for the manufacture thereof in accordance with a preferred embodiment of the present invention. It should be noted that like parts appearing in FIG. 2 and FIGS. 3A to 3D are represented by like reference numerals.

Figure 2:
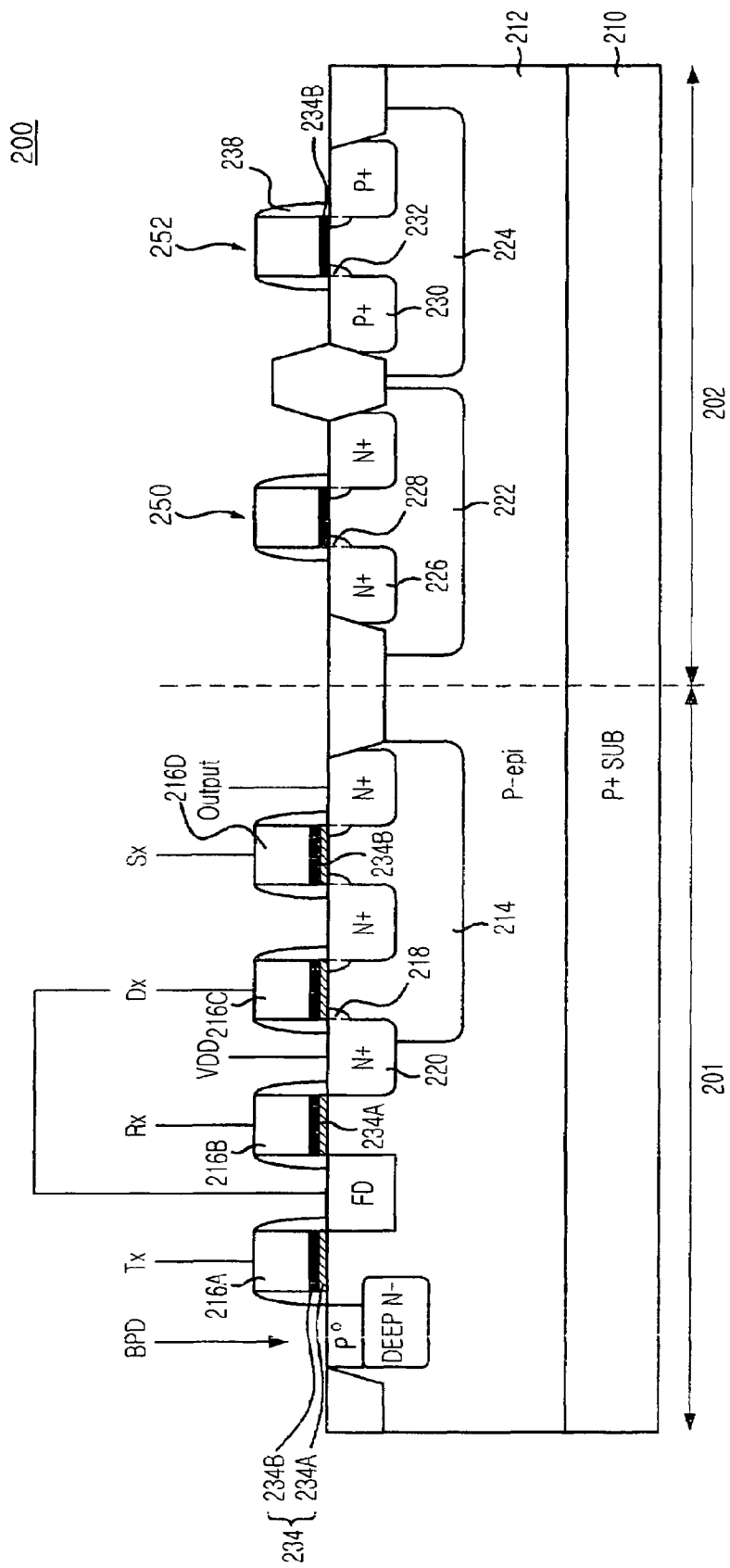
FIG. 2 is a cross sectional view setting forth a CMOS image sensor having a double gate insulator in a pixel array in accordance with a preferred embodiment of the present invention.

Referring to FIG. 2, there is provided a cross sectional view of an inventive CMOS image sensor 200 including a semiconductor substrate 210, a p-type epitaxial layer 212, a pixel array 201, a logic circuit 202 and field oxide (FOX) regions. Herein, the p-type epitaxial layer 212 is formed by epitaxially growing up an upper portion of the p-type semiconductor substrate 210. The pixel array 201 and the logic circuit 202 are isolated from each other by forming a FOX region of a shallow trench isolation (STI) therebetween. Additionally, another FOX region of the STI formed in the logic circuit isolates elements in the logic circuit from each other.

In the pixel array 201, a p-well 214 is formed in a predetermined location of the p-type epitaxial layer 212 in the pixel array 201, where a drive transistor (Dx) and a select transistor (Sx) are formed in a post fabrication process. In the other predetermined location of the p-type epitaxial layer 212 in the pixel array, there is formed a buried photodiode (BPD), where a transfer transistor (Tx) and a reset transistor (Rx) are formed by a post fabrication process. Herein, the BPD has a PN junction of a deep n-type diffusion layer (DEEP N$^-$) and a shallow p-type diffusion layer (P$^0$), wherein the p-type diffusion layer (P$^0$) is formed on the deep n-type diffusion layer (DEEP N$^-$) by using a method such as an ion-implantation technique or the like.

One side of a gate electrode 216A of the transfer transistor (Tx) is connected to the BPD and the other side is connected to a floating diffusion region (FD), wherein the gate electrode 216A of the transfer transistor (Tx) is formed on a double gate insulator having a first and a second gate insulators 234A, 234B.

In addition, one side of a gate electrode 216B of the reset transistor (Rx) is connected to the floating diffusion region (FD) and the other side is connected to a power supply voltage (VDD), wherein the gate electrode 216B of the reset transistor (Rx) is also formed on the double gate insulator 234.

The drive transistor (Dx) and the select transistor (Sx) have each n-type lightly doped drains (N-LDD) 218 in source/drain regions 220 by ion-implanting p-type atoms into the p-well 214, while the reset transistor (Rx) and transfer transistor (Tx) have no N-LDDs therein. One of the source/drain regions 220 of the select transistor (Sx) plays a role as an output. A gate electrode 216C of the drive transistor (Dx) is connected to the floating diffusion region (FD).

In the inventive CMOS image sensor 200, each transistor in the pixel array 201 has a gate structure of a double gate insulator 234. In detail, the first gate insulator 234A is formed on the p-type epitaxial layer 212 and the second gate insulator 234B is formed on the first gate insulator 234A. Herein, a thickness of the double gate insulator 234 is preferably in range of about 40 Å to about 90 Å.

In the logic circuit 202, there is a p-well 222 for forming an n-MOSFET (n-type metal-oxide-silicon field effect transistor) 250 and an n-well 224 for forming a p-MOSFET 252, wherein the p-well 222 and the n-well 224 are disposed side by side in the p-type epitaxial layer 212. The n-MOSFET 250 has source/drain regions 226 with N-LDDs 228 by ion-implanting p-type atoms into the p-well 222 and the p-MOSFET 252 has source/drain regions 230 with P-LDDs 232 by ion-implanting n-type atoms into the n-well 224.

Unlike the gate structure of each transistor in the pixel array 201, each transistor in the logic circuit 202 has a single gate insulator, i.e., the second gate insulator 234B. The thickness of the single gate insulator is in the range of about 5 Å to about 40 Å.

Referring to FIGS. 3A to 3D, there are shown cross sectional views setting forth a method for manufacturing a CMOS image sensor 200 in accordance with a preferred embodiment of the present invention.

Figure 3A:
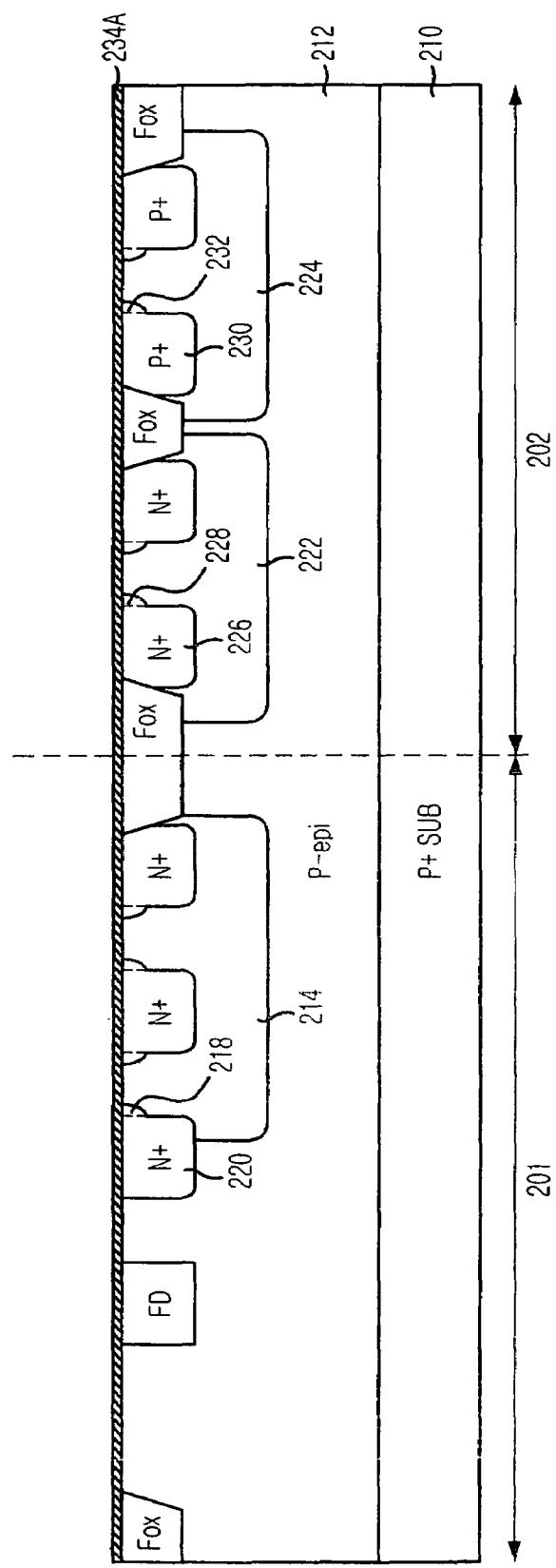
FIGS. 3A to 3D are cross sectional views setting forth a method for manufacturing a CMOS image sensor having a double gate insulator in a pixel array in accordance with a preferred embodiment of the present invention.

In FIG. 3A, the inventive method for manufacturing the CMOS image sensor 200 begins with preparing a p-type semiconductor substrate 210 incorporating therein a p-type epitaxial layer 212 formed by epitaxially growing up an upper portion of the semiconductor substrate 210, wherein the semiconductor substrate 210 is divided into two parts of which one is a pixel array 201 and the other is a logic circuit 202.

Thereafter, a field oxide (FOX) region is formed in a predetermined location of the p-type epitaxial layer 212 disposed between the pixel array 201 and the logic circuit 202 by using a method such as a shallow trench isolation (STI) process or the like, for isolating the pixel array from the logic circuit. Then, a first p-well 214 is formed in the p-type epitaxial layer 212 of the pixel array 201 by using a method such as an ion-implantation process or the like. In the logic circuit 202, there is formed a second p-well 222 and an n-well 224 by using a similar method for forming the first p-well 214.

Subsequently, a first gate insulator 234A is formed on a top face of the p-type epitaxial layer 212, wherein the first gate insulator 234A can employ silicon oxide ($SiO_2$) by thermally oxidizing the p-type epitaxial layer 212.

Figure 3B:
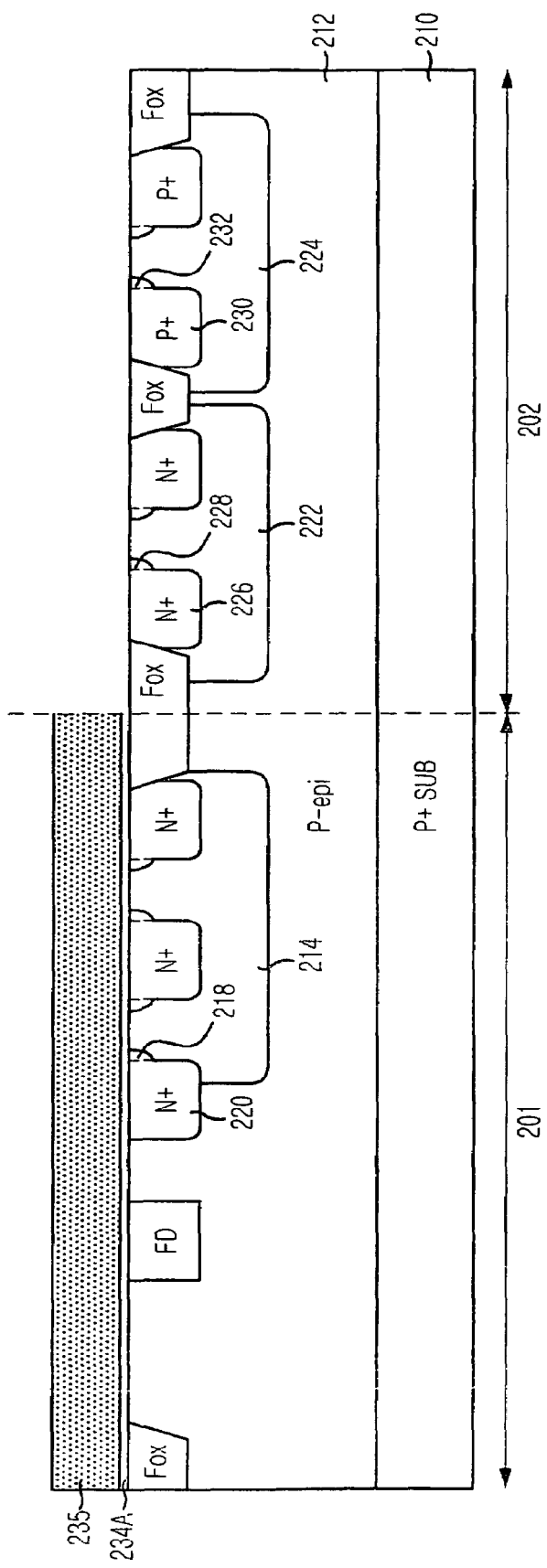

In an ensuing step, referring to FIG. 3B, a mask layer, e.g., a photosensitive film, is formed on a top face of the first gate insulator 234A and is patterned into a predetermined configuration through a light exposure and a development processes, thereby forming a mask 235 formed only on the top face of the first gate insulator 234A in the p-type epitaxial layer 212 of the pixel array 201. Next, the first gate insulator 234A in the logic circuit 202 is wet-etched by using the mask 235 as an etch mask, whereby the first gate insulator 234A remains only on the top face of the p-type epitaxial layer 212 of the pixel array 201. Herein, a wet-etching process is carried out by using hydrofluoric acid (HF), buffered oxide etchant (BOE) or the like.

Figure 3C:
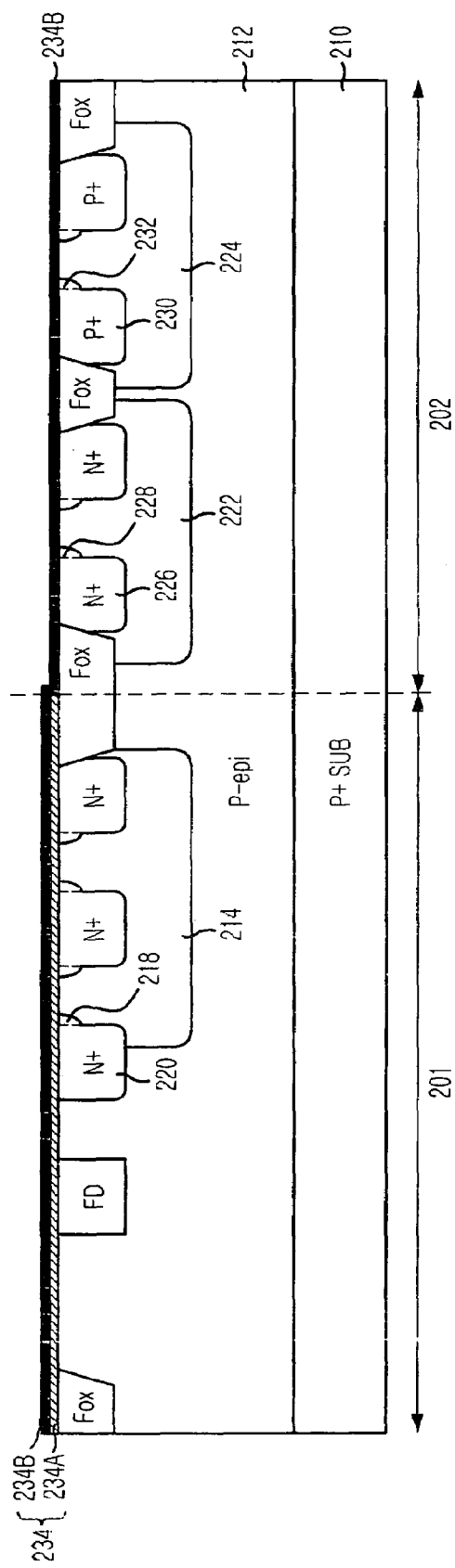

In a next step, referring to FIG. 3C, the mask 235 is removed by means of a predetermined etching process such as a dry etching process making use of an oxygen ($O_2$) plasma, a wet etching process making use of a sulfuric acid ($H_2SO_4$), an etching process making use of a thinner or the like. Thereafter, a second gate insulator 234B is formed on the first gate insulator 234A and the p-type epitaxial layer 212 of the logic circuit 202. In the result, each transistor in the pixel array 201 has a thick double gate insulator 234 while each transistor in the logic circuit 202 has a single layer of the second gate insulator 234B. Herein, it is preferable to form the thick double gate insulator 234 with the thickness ranging from about 40 Å to about 90 Å and the single layer of the second gate insulator 234B with the thickness ranging from about 5 Å to about 40 Å.

Figure 3D:
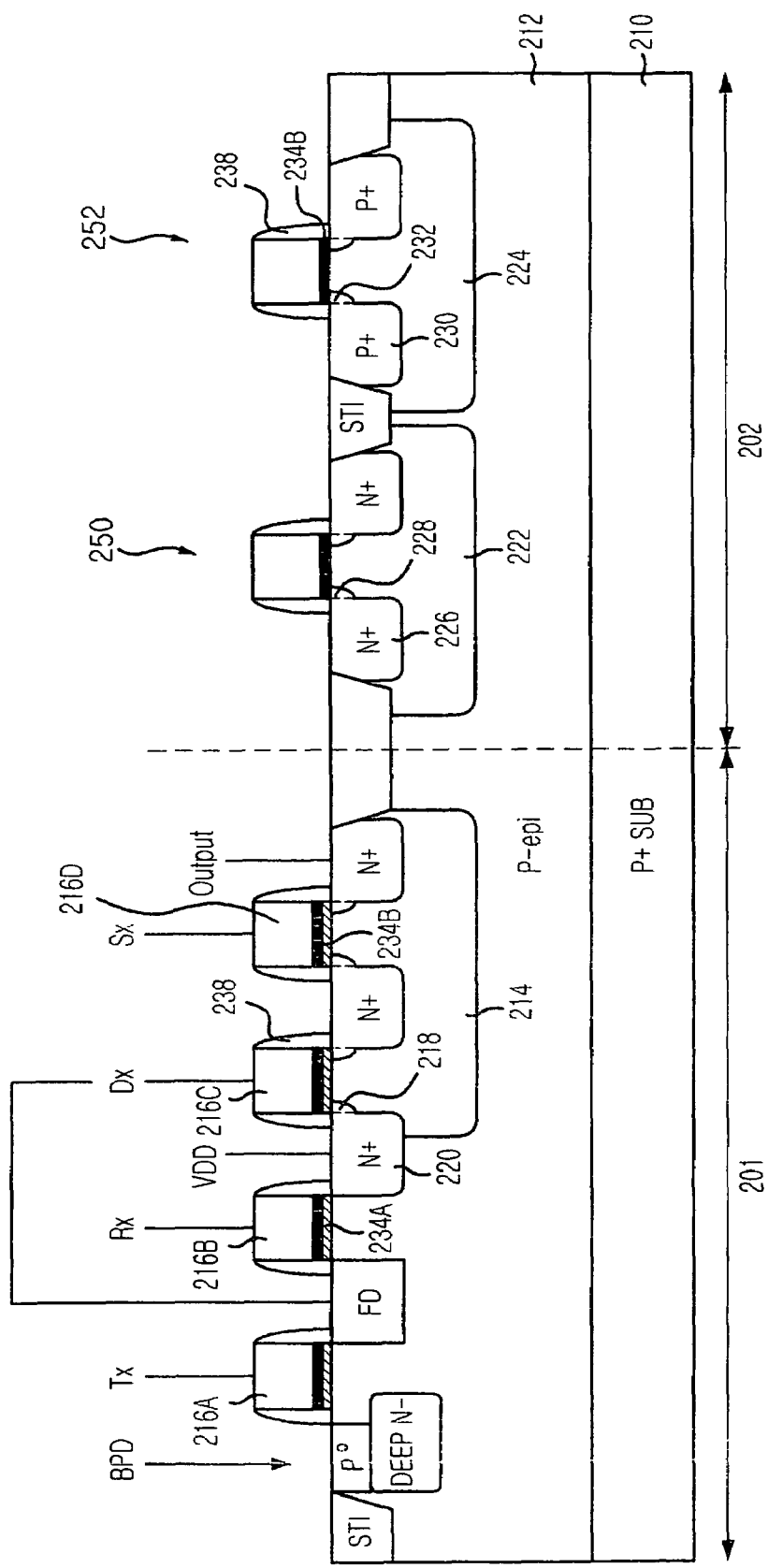

Finally, referring to FIG. 3D, a buried photodiode (BPD), a transfer transistor (Tx), a reset transistor (Rx), a drive transistor (Dx) and a select transistor (Sx) are formed in the pixel array 201. In addition, an n-MOSFET 250 and a p-MOSFET 252 are formed in the logic circuit 202. Therefore, an inventive CMOS image sensor 200 is achieved. Herein, the processes for fabricating above transistors and MOSFETs are well-known to those skilled in the art, so further explanation will be abbreviated in the present invention.

As aforementioned already, the inventive CMOS image sensor 200 employs the double gate insulator 234 in the pixel array 201 compared with the conventional CMOS image sensor 100 employing a single gate insulator therein. Therefore, the inventive CMOS image sensor 200 has an advantage that it is possible to apply high operating voltage ranging from about 2.5 V to 3.3 V so as to secure sufficient saturated charges due to the thick double gate insulator 234 in the pixel array 201. In addition, it is also possible to secure an appropriate dynamic range because of the sufficient saturated charges.

Furthermore, it is possible to reduce the capacitance of the floating diffusion region (FD) by reducing the capacitance of the gate insulator 234 of the drive transistor (Dx) which is connected to the floating diffusion region (FD). In addition, an increase of an electron-voltage conversion gain results in improving a photosensitivity of the CMOS image sensor 200.

Meanwhile, there is employed a single gate insulator, i.e., the second gate insulator 234B, in the logic circuit 202 so that it is possible to apply low operating voltage less than 1.8 V, to thereby reducing power dissipation. Accordingly, the inventive CMOS image sensor 200 can be applicable to a portable manufactures such as a mobile phone, a digital camera or the like which requires high speed and high efficiency property.

While the present invention has been described with respect to the particular embodiments, it will be apparent to those skilled in the art that various changes and modifications may be made without departing from the scope of the invention as defined in the following claims.

What is claimed is:

1. A method for manufacturing a complementary metal-oxide semiconductor (CMOS) image sensor, the method comprising:

preparing a semiconductor substrate having a p-type epitaxial layer, wherein the semiconductor substrate includes a pixel array area and a logic circuit area;

forming a plurality of doped regions in the p-type epitaxial layer of the pixel array area to fabricate a plurality of pixel sensors grouped with one another in the pixel array area, wherein doped regions for each pixel sensor are provided to fabricate a photodiode, a MOSFET transfer transistor, a MOSFET reset transistor, a MOSFET drive transistor, and a MOSFET select transistor;

forming a plurality of doped regions in the p-type epitaxial layer of the logic circuit area to fabricate a plurality of MOSFET transistors in the logic circuit area, wherein the plurality of MOSFET transistors in the logic circuit area include one or more n-channel MOSFETs and one or more p-channel MOSFETs;

forming a field oxide in a region around the pixel array area to physically separate and isolate the plurality of pixel sensors in the pixel array area from the plurality of MOSFET transistors in the logic circuit area;

depositing a first gate insulating layer concurrently over both the pixel array area and the logic circuit area;

forming a mask over the first gate insulating layer on the pixel array area, wherein the mask leaves the first gate insulating layer over the logic circuit area exposed;

removing the first gate insulating layer from the logic circuit area while leaving the first gate insulating layer over the pixel array area intact;

removing the mask from the pixel array area;

depositing a second gate insulating layer over both the pixel array area and the logic circuit area;

removing the second gate insulating layer from selected areas of the logic circuit area to leave gate areas available for use in completing fabrication of the plurality of MOSFET transistors in the logic circuit area, wherein the gate area for each of the plurality of MOSFET transistors in the logic circuit area has a thickness from approximately 5 Å to approximately 40 Å; and removing both the first and second gate insulating layers from selected areas of the pixel array area to leave gate areas formed by the first and second gate insulating layers available for use in completing fabrication of the MOSFET transfer transistor, the MOSFET reset transistor, the MOSFET drive transistor, and the MOSFET select transistor for each of the pixel sensors, wherein the gate area for each MOSFET transistor in the pixel array area has a gate insulating layer thickness from approximately 40 Å to approximately 90 Å, and wherein the thickness of the gate insulating layer of the MOSFETs in the pixel array area is greater than the thickness of the gate insulating layer of the MOSFETs in the logic circuit area.

2. The method of claim 1, wherein said removing the first gate insulating layer from the logic circuit area is carried out by using a wet-etching process.

3. The method of claim 1, wherein said removing the first gate insulating layer from the logic circuit area is carried out by using a hydrofluoric acid (HF) process.

4. The method of claim 1, wherein said removing the first gate insulating layer from the logic circuit area is carried out by using a buffered oxide etchant (BOE) process.

5. The method of claim 1, wherein said removing the mask from the pixel array area is carried out by using an $O_2$ plasma process.

6. The method of claim 1, wherein said removing the mask from the pixel array area is carried out by using a sulfuric acid ($H_2SO_4$) process.

7. The method of claim 1, wherein said removing the mask from the pixel array area is carried out by using a thinner.

8. The method of claim 1, wherein the first gate insulating layer comprises silicon oxide ($SiO_2$) formed by thermally oxidizing the p-type epitaxial layer.

9. A method for manufacturing a complementary metal-oxide semiconductor (CMOS) image sensor, the method comprising:
preparing a semiconductor substrate by growing a p-type epitaxial layer on a surface of the semiconductor substrate and doping the p-type epitaxial layer to fabricate a plurality of MOSFET transistors;
forming a pixel array in a first area of the semiconductor substrate, wherein each pixel of the pixel array includes doping for a MOSFET transfer transistor, a MOSFET reset transistor, a MOSFET drive transistor, a MOSFET select transistor, and a photodiode, wherein each MOSFET transistor in the first area has a gate insulator formed from at least two insulator layers applied to both the first area and a second area during separate depositions, wherein the deposition of each insulator layer is done in a single deposition process over both the first and second areas, and wherein the at least two insulator layers have a combined thickness ranging from 40 Å to 90 Å; and
forming a logic circuit in the second area of the semiconductor substrate, wherein the logic circuit has a plurality of MOSFET transistors, wherein each of the MOSFET transistors in the second area has a gate insulator formed from a single insulating layer of the at least two insulating layers, and wherein the single insulating layer has a thickness ranging from 5 Å to 40 Å, and wherein the thickness of the gate insulators of each MOSFET transistor in the first area is larger than the gate insulators of the plurality of MOSFET transistors in the second area; and
depositing a field oxide in the p-type epitaxial layer in a region around the pixel array to isolate the pixel array from the logic circuit.

10. The method of claim 9, wherein said preparing a semiconductor substrate and said forming a pixel array comprise:
forming, concurrently over both the first and second areas, a first insulating layer on a surface of the p-type epitaxial layer;
forming a mask over the first insulating layer on the first area;
removing the first insulating layer from the second area while leaving intact the masked portions of the first insulating layer on the first area;
removing the mask from the second area;
forming, concurrently over both the first and second areas, a second insulating layer.

11. The method of claim 10, wherein said removing the first insulating layer from the second area is carried out by using a wet-etching process.

12. The method of claim 11, wherein said removing the first insulating layer from the second area is carried out by using a hydrofluoric acid (HF) process.

13. The method of claim 11, wherein said removing the first insulating layer from the second area is carried out by using a buffered oxide etchant (BOE) process.

14. The method of claim 10, wherein said removing the mask from the second area is carried out by using an $O_2$ plasma process.

15. The method of claim 10, wherein said removing the mask from the second area is carried out by using a sulfuric acid ($H_2SO_4$) process.

16. The method of claim 10, wherein said removing the mask from the second area is carried out by using a thinner.

17. The method of claim 10, wherein the first insulating layer comprises silicon oxide ($SiO_2$) formed by thermally oxidizing the p-type epitaxial layer.

18. A complementary metal-oxide semiconductor (CMOS) image sensor, comprising:
a semiconductor substrate having a p-type epitaxial layer formed on a surface of the semiconductor substrate;
a pixel array formed in a first area of the semiconductor substrate, wherein each pixel of the pixel array includes a MOSFET transfer transistor, a MOSFET reset transistor, a MOSFET drive transistor, a MOSFET select transistor, and a photodiode, wherein each MOSFET transistor of the pixel array has a gate insulator formed through deposition of at least two insulating layers, and wherein each gate insulator has a thickness ranging from 40 Å to 90 Å;
a logic circuit formed in a second area of the semiconductor substrate, wherein the logic circuit includes a plurality of MOSFET transistors, and wherein each gate insulator for the plurality of MOSFET transistors of the logic circuit is formed from a first one of the at least two insulating layers and has a thickness ranging from 5 Å to 40 Å, wherein the gate insulator of each MOSFET transistor in the first area is greater than the thickness of the gate insulators of the plurality of MOSFET transistors in the second area; and
a field oxide formed in the p-type epitaxial layer in a region around the pixel array and configured to isolate the pixel array from the logic circuit.

* * * * *